United States Patent [19]

Bujatti et al.

[11] Patent Number: 5,023,994
[45] Date of Patent: Jun. 18, 1991

[54] METHOD OF MANUFACTURING A MICROWAVE INTERGRATED CIRCUIT SUBSTRATE INCLUDING METAL LINED VIA HOLES

[75] Inventors: Marina Bujatti; Franco N. Sechi, both of Palo Alto, Calif.

[73] Assignee: Microwave Power, Inc., Santa Clara, Calif.

[21] Appl. No.: 251,539

[22] Filed: Sep. 29, 1988

[51] Int. Cl.$^5$ ............................................. H05K 3/00
[52] U.S. Cl. ..................................... 29/852; 174/250
[58] Field of Search ..................... 174/68.5, 250, 255, 174/266; 204/192.15, 192.17; 29/846, 852; 427/99

[56] References Cited

U.S. PATENT DOCUMENTS

| | | | |
|---|---|---|---|
| 3,319,317 | 5/1967 | Roche et al. | 174/68.5 |
| 3,471,631 | 10/1969 | Quintana | 174/68.5 |
| 4,191,789 | 3/1980 | Brown et al. | 29/852 |
| 4,263,341 | 4/1981 | Martyniak | 174/60.5 X |
| 4,393,096 | 7/1983 | Gajda | 427/99 X |
| 4,430,364 | 2/1984 | Ito | 427/99 X |
| 4,642,160 | 2/1987 | Burgess | 29/852 X |
| 4,712,161 | 12/1987 | Pryor et al. | 174/68.5 X |
| 4,717,462 | 1/1988 | Homma et al. | 204/192.15 X |
| 4,783,248 | 11/1988 | Kohlhase et al. | 204/192.17 |
| 4,795,670 | 1/1989 | Nishigaki et al. | 174/68.5 X |

*Primary Examiner*—Morris H. Nimmo
*Attorney, Agent, or Firm*—Flehr, Hohbach, Test, Albritton & Herbert

[57] ABSTRACT

A method of forming a microwave integrated circuit substrate which includes via holes connecting the upper and lower surfaces of the substrate in which the upper end of the via hole is closed by a conductive membrane.

4 Claims, 2 Drawing Sheets

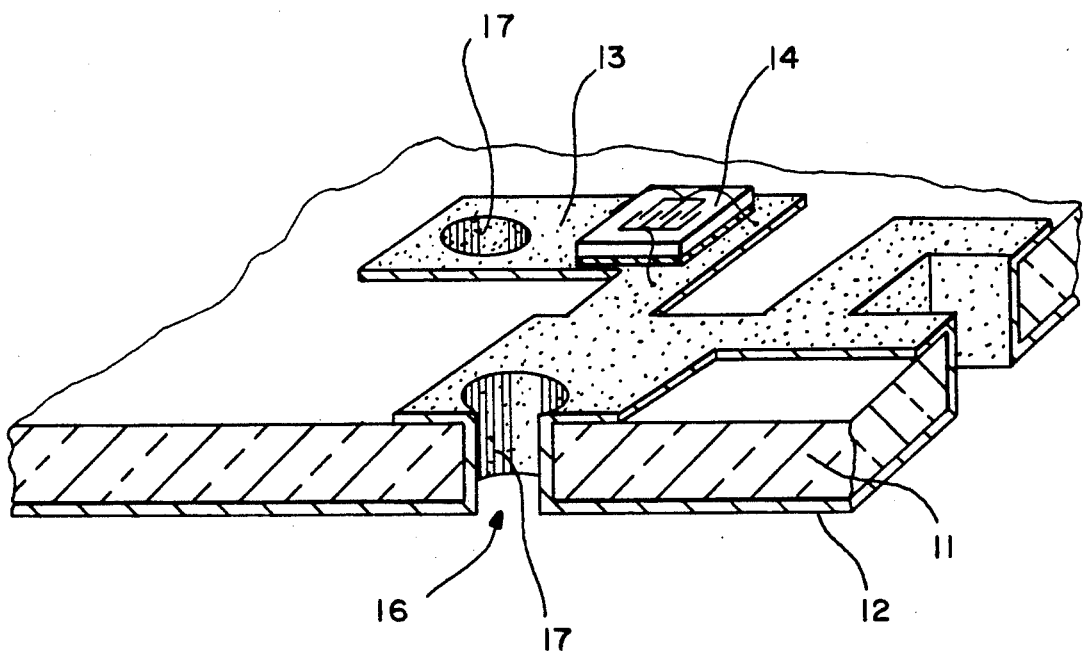
FIG.—1

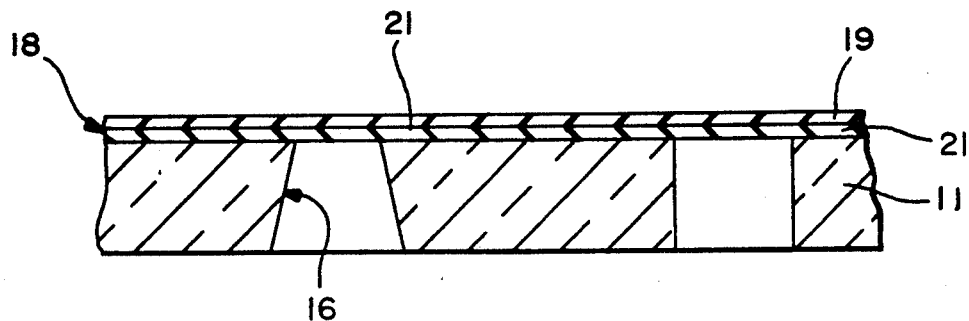
FIG.—2A
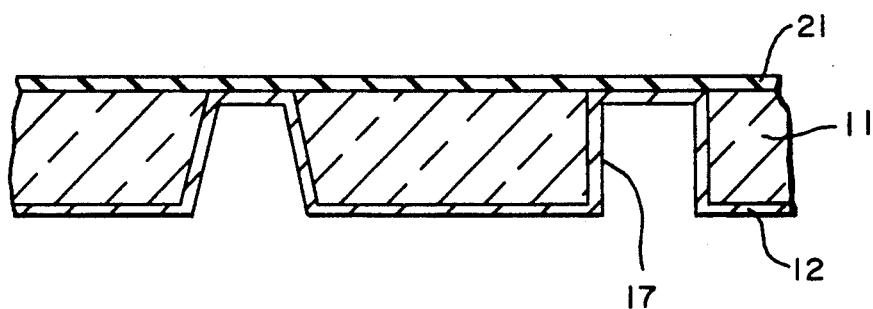
FIG.—2B
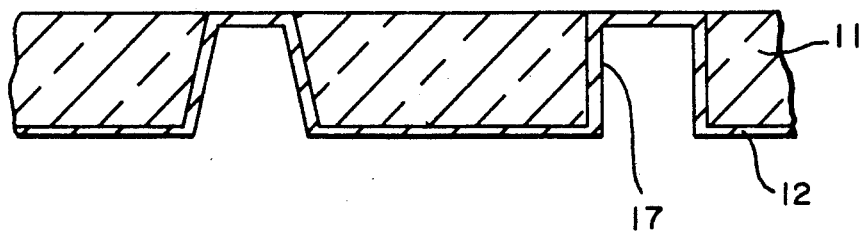
FIG.—2C

METHOD OF MANUFACTURING A MICROWAVE INTERGRATED CIRCUIT SUBSTRATE INCLUDING METAL LINED VIA HOLES

BRIEF DESCRIPTION OF THE INVENTION

This invention relates generally to microwave integrated circuit substrates and to a method of forming and more particularly to such substrates which include via holes connecting the upper and lower surfaces of the substrate and to methods of formation in which the upper end of the via holes is closed by a conductive membrane.

BACKGROUND OF THE INVENTION

Microwave integrated circuits generally comprise a circuit including passive and active components and interconnecting leads mounted on the upper surface of a substrate with a metal layer or film on the lower surface serving as a heat sink and/or path to ground. It is often desirable to create direct connections between specific points of the circuit on the upper surface and the lower surface metal either to form a low inductance/low resistance conductive path to ground and/or to provide a heat conductive path to the lower surface metal, specifically in the vicinity of active devices. In the present state of the art when the substrate used is a ceramic substrate, such connections are typically obtained by cutting holes, referred to as "via holes" or "vias", through the substrate and by metallizing the walls of the hole to provide a conductive connection between the top and bottom of the holes. The holes may be cut either before or after processing of the substrate. In the first case, the presence of holes significantly hinders the photolithography processes used in the formation of the microwave circuits and their electrical interconnection typically preventing the definition of fine detail in the neighborhood of a hole. In the second case, the hole cutting process is severely limited by the need to preserve the integrity of the circuit which has already been fabricated. This is especially true in the case of ceramic substrates such as alumina where holes cannot be easily etched chemically and have to be drilled mechanically or by laser.

OBJECTS AND SUMMARY OF THE INVENTION

It is an object of the present invention to provide a substrate having metallized vias with the upper end of the vias closed by a metal layer to provide planar surface for subsequent photolithographic processing of circuits.

It is another object of the present invention to provide a substrate with closed via holes to provide a planar upper surface for improved circuit processing.

The foregoing and other objects of the present invention are achieved by substrate comprising a body of insulating material having upper and lower major surfaces with one or more holes formed in said body to extend between the upper and lower surfaces, a metal layer formed on the walls of the said holes extending between the upper and lower surfaces, a metal layer formed on the lower surface of said body and connected to the metal layer formed on the walls of said holes and a metal layer closing the upper end of said holes and planar with the upper surface of said body. The invention is further directed to a method of forming the aforementioned substrate.

BRIEF DESCRIPTION OF THE DRAWINGS

FIG. 1 shows a portion of a microwave integrated circuit formed on a substrate in accordance with the prior art with via hole walls metallized to provide electrical connection between the upper and lower surfaces of the substrate.

FIGS. 2A–2C show the steps in forming a substrate with via holes closed by a metal membrane to provide a planar upper surface in accordance with the invention.

DETAILED DESCRIPTION OF THE PREFERRED EMBODIMENT

A portion of a typical prior art microwave integrated circuit is shown in FIG. 1. The circuit includes an insulating substrate 11, typically alumina or beryllia, coated on the lower surface with a metallic coating or layer 12, typically a two-layer coating including a chromium coating which adheres to the substrate and a layer of good conductive material such as gold. A similar coating on the upper side is processed by photolithography and etching to define a desired circuit geometry 13 which connects various inactive components such as capacitors, resistors (not shown) and active devices such as device 14. The various components are attached at specific positions on the upper surface. Selected points of the upper circuits are connected to the back side by holes or vias 16 with walls including a layer of metal 17. Active devices are typically located in the vicinity of the via holes both because one of their electrodes typically needs to be grounded to the bottom metal layer, and also, in order to transfer heat to the backside metal layer 12 to help dissipate the heat generated by the active device.

FIGS. 2A–2C which show the preferred method of manufacture and the substrate of the present invention. Via holes 16 are first drilled as by a laser through the substrate 11. In accordance with one method of the present invention, a laminated photoresist layer 18 is applied to the upper surface of the substrate 11 to tent over or close the holes 16. One example of a laminated photoresist is the dry film photoresist Riston manufactured by DuPont and used extensively in the manufacture of printed circuits. The laminated film 18 comprises an upper mylar layer 19 to which is adhered a photoresistive layer 21. The layer 21 has good adherence characteristics so that it adheres to the ceramic substrate and preferably also has the ability to withstand elevated temperatures. In practice the laminated layer comprising layers 19 and 21 includes an additional protective layer on the layer 21. In use, the protective layer is removed and the film 18 adheres to the upper surface of the substrate 11 to cover or tent the holes or vias 16. The assembly is shown in FIG. 2A.

The substrate and layer 18 are then baked at an elevated temperature and then placed in a sputtering system with the mylar film 19 in good intimate thermal contact to the cool surface of the substrate holders with the open end of the holes or vias 16 facing the sputtering target. A sputtering deposition system is preferred in this embodiment because it is a well known characteristic of the sputtering process to be able to cover vertical walls such as the edges of the vias or holes. In such a process, a material is sputtered from a sputtering target in a vacuum and material travels to and deposits upon adjacent surfaces, such as the surfaces of the substrate 11 vias 16 and the exposed surface of the layer 21. Preferably a multiple layer metallization is carried out by alternately depositing layers of Titanium-Tungsten alloy and gold until the layer is approximately 10 microns. The sputtered layer serves as the back metallization surface 12 of the substrate and the metallization 17 for the walls of the holes or vias 16. The deposited layer has sufficient mechanical strength and thickness to close the top of the holes or vias and form a self-sustaining membrane. The layer 18 is then removed by first removing the mylar backing with a suitable stripper, such as acetone or methylene chloride or others, depending on the specific polymer used. Stripping can also be accomplished by ashing. At this point in the process, the substrate, with holes closed by the metallic membranes which are conductively connected to the back layer 12, is completed, FIG. 2C.

There is therefore provided a substrate and method of manufacture having a planar upper surface which can be utilized in the formation of microwave circuits by front metallization, circuit deposition and installation of components.

We claim:

1. The method of forming a substrate for microwave integrated circuits which comprises the steps of:
    a) forming in a body of insulating material through holes at preselected locations to extend between the upper and lower surface of said body;
    b) providing a removable layer on the upper surface of said body which covers at least the upper end of said holes;
    c) depositing a metal layer on the bottom surface of said body, the walls of said holes and the underside of said removable layer; and
    d) removing said removable layer to leave an insulating body having a planar upper surface composed of the insulating material and metal layer at said holes.

2. A method as in claim 1 in which the metal layer is deposited by sputtering.

3. A method as in claim 1 in which the removable layer is a laminated layer.

4. The method of forming an alumina substrate for microwave integrated circuits comprising the steps of:
    a) forming in a body of alumina having upper and lower surfaces through holes at selected locations to extend between said surfaces;
    b) adhering a removable layer of flexible material to the upper surface of said body to cover the upper end of said holes;
    c) depositing a metal layer on the bottom surface of said body, the walls of said holes and the underside of said removable flexible layer to close the upper end of said holes; and
    d) removing the flexible layer to leave the alumina body having a planar upper surface comprised of the surface of said body and the metal closing the upper end of said holes.

* * * * *